US010290721B2

(12) United States Patent
Larrey et al.

(10) Patent No.: US 10,290,721 B2
(45) Date of Patent: May 14, 2019

(54) METHOD OF FABRICATING AN ELECTROMECHANICAL STRUCTURE INCLUDING AT LEAST ONE MECHANICAL REINFORCING PILLAR

(71) Applicant: Commissariat A L'energie Atomique Et Aux Energies Alternatives, Paris (FR)

(72) Inventors: Vincent Larrey, La Murette (FR); Francois Perruchot, Grenoble (FR); Bernard Diem, Echirolles (FR); Laurent Clavelier, Grenoble (FR); Philippe Robert, Grenoble (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 589 days.

(21) Appl. No.: 13/912,307

(22) Filed: Jun. 7, 2013

(65) Prior Publication Data
US 2013/0273683 A1 Oct. 17, 2013

Related U.S. Application Data

(62) Division of application No. 12/488,841, filed on Jun. 22, 2009, now abandoned.

(30) Foreign Application Priority Data

Jun. 23, 2008 (FR) ...................................... 08 03495

(51) Int. Cl.
*H01L 21/00* (2006.01)
*H01L 29/66* (2006.01)
*B81C 1/00* (2006.01)

(52) U.S. Cl.
CPC .... *H01L 29/66007* (2013.01); *B81C 1/00357* (2013.01); *B81C 1/00682* (2013.01);
(Continued)

(58) Field of Classification Search
CPC ......... H01L 2924/0002; H01L 2924/00; H01L 29/66007; H01L 2201/0264;
(Continued)

(56) References Cited

U.S. PATENT DOCUMENTS 5,987,989 A 11/1999 Yamamoto et al.
6,913,941 B2 7/2005 O'Brien et al.
(Continued)

FOREIGN PATENT DOCUMENTS

FR 2 859 201 A1 3/2005
WO WO-2006/035031 A1 4/2006

OTHER PUBLICATIONS

International Search Report for French Application No. 08/03495, filed Jun. 23, 2008.
(Continued)

*Primary Examiner* — Meiya Li
(74) *Attorney, Agent, or Firm* — Alston & Bird LLP

(57) ABSTRACT

The invention provides a method of fabricating an electromechanical structure presenting a first substrate including a layer of monocrystalline material covered in a sacrificial layer that presents a free surface, the structure presenting a mechanical reinforcing pillar in the sacrificial layer, the method including etching a well region in the sacrificial layer to define a mechanical pillar; depositing a first functionalization layer of the first material to at least partially fill the well region and cover the free surface of the sacrificial layer around the well region; depositing a second material different from the first material for terminating the filling of the well region to thereby cover the first functionalization
(Continued)

layer around the well region, planarizing the filler layer, the pillar being formed by the superposition of the first material and second material in the well region; and releasing the electromechanical structure by removing at least partially the sacrificial layer.

9 Claims, 4 Drawing Sheets

(52) U.S. Cl.
CPC . *B81B 2201/0264* (2013.01); *B81C 2201/019* (2013.01); *H01L 2924/0002* (2013.01)

(58) Field of Classification Search
CPC ............ B81C 1/00357; B81C 1/00682; B81C 2201/019; B81B 2201/0264
See application file for complete search history.

(56) References Cited

U.S. PATENT DOCUMENTS

| | | | |
|---|---|---|---|
| 6,916,728 | B2 | 7/2005 | Gogoi et al. |
| 6,952,041 | B2 | 10/2005 | Lutz et al. |
| 7,671,429 | B2 | 5/2010 | Grange et al. |
| 2002/0079550 | A1 | 6/2002 | Daneman et al. |
| 2004/0099928 | A1 | 5/2004 | Nunan et al. |
| 2004/0256689 | A1 | 12/2004 | Wachtmann et al. |
| 2005/0052724 | A1 | 3/2005 | Suzuki et al. |
| 2007/0001267 | A1 | 1/2007 | Ayazi et al. |
| 2007/0019280 | A1* | 1/2007 | Sasagawa ............... B81B 3/007 359/315 |
| 2007/0072327 | A1 | 3/2007 | Weigold |
| 2008/0311429 | A1* | 12/2008 | Katsuragawa ........... G11B 5/65 428/820.1 |
| 2009/0026559 | A1 | 1/2009 | Detry |
| 2009/0061578 | A1 | 3/2009 | Tan et al. |

OTHER PUBLICATIONS

Brosnihan T J et al: "Embedded interconnect and electrical isolation for high-aspect-ratio, SOI inertial instruments"; 1997 International Conference on Solid-State Sensors and Actuators; Digest of Technical Papers; Transducers 97; Chicago, IL; vol. 1, Jun. 16, 1997; pp. 637-640; XP010240558.

Search Report from European Application No. 09290473.

Seok et al: "A high performance mixed micromachined differential resonant accelerometer"; Proceedings of the IEEE Sensors 2002. Orlando, FL; Jun. 12-14, 2002; vol. 2, Jun. 12, 2002; p. 1058-1063; XP010605258.

Yamamoto, T. et al.: "Capacitive accelerometer with high aspect ratio single crystalline silicon microstructure using the SOI structure with polysilicon-based interconnect technique." MEMS 2000, the thirteenth annual international conference, Jan. 23-27, 2000.

O'Brien, G.J. et al: "MEMS process flow insensitive to time etch induced anchor perimeter variation on SOI and bulk silicon wafer substrates" IEEE 2000, pp. 481-484.

Schiltz et al: "Two-layer planarization process." J. Electrochem. Soc. 133: 178-181 (1986).

Bogumilowicz, Y. et al.: "Selective chemical vapor etching of Si1-xGex versus Si with gaseous HCl" Semicond. Sci. Technol. 21, No. 12 (2006) pp. 1668-1674.

"The Japan Society of Applied Physics." Japanese Journal of Applied Physics, vol. 43, No. 6B (2004) pp. 3964-3966.

* cited by examiner

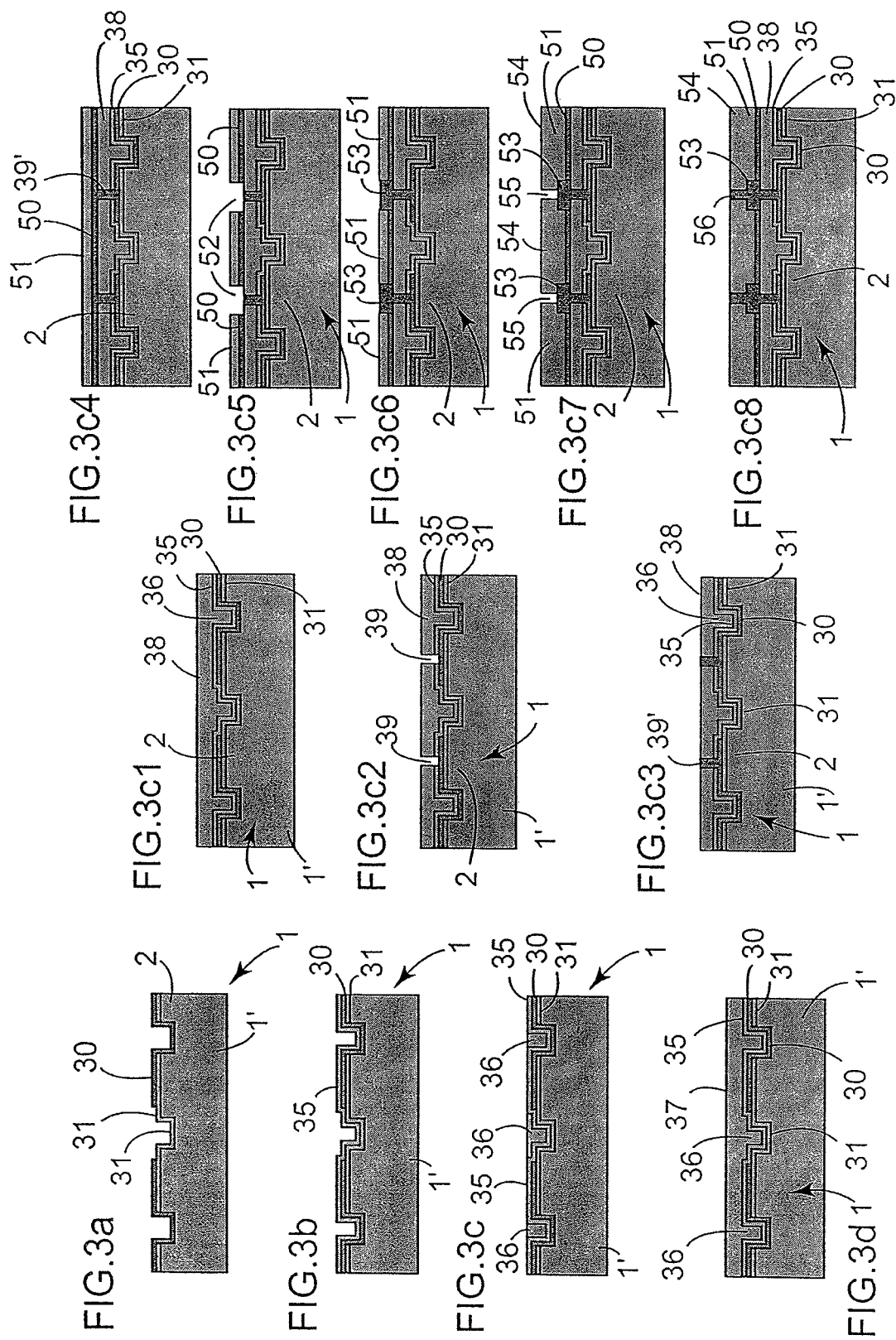

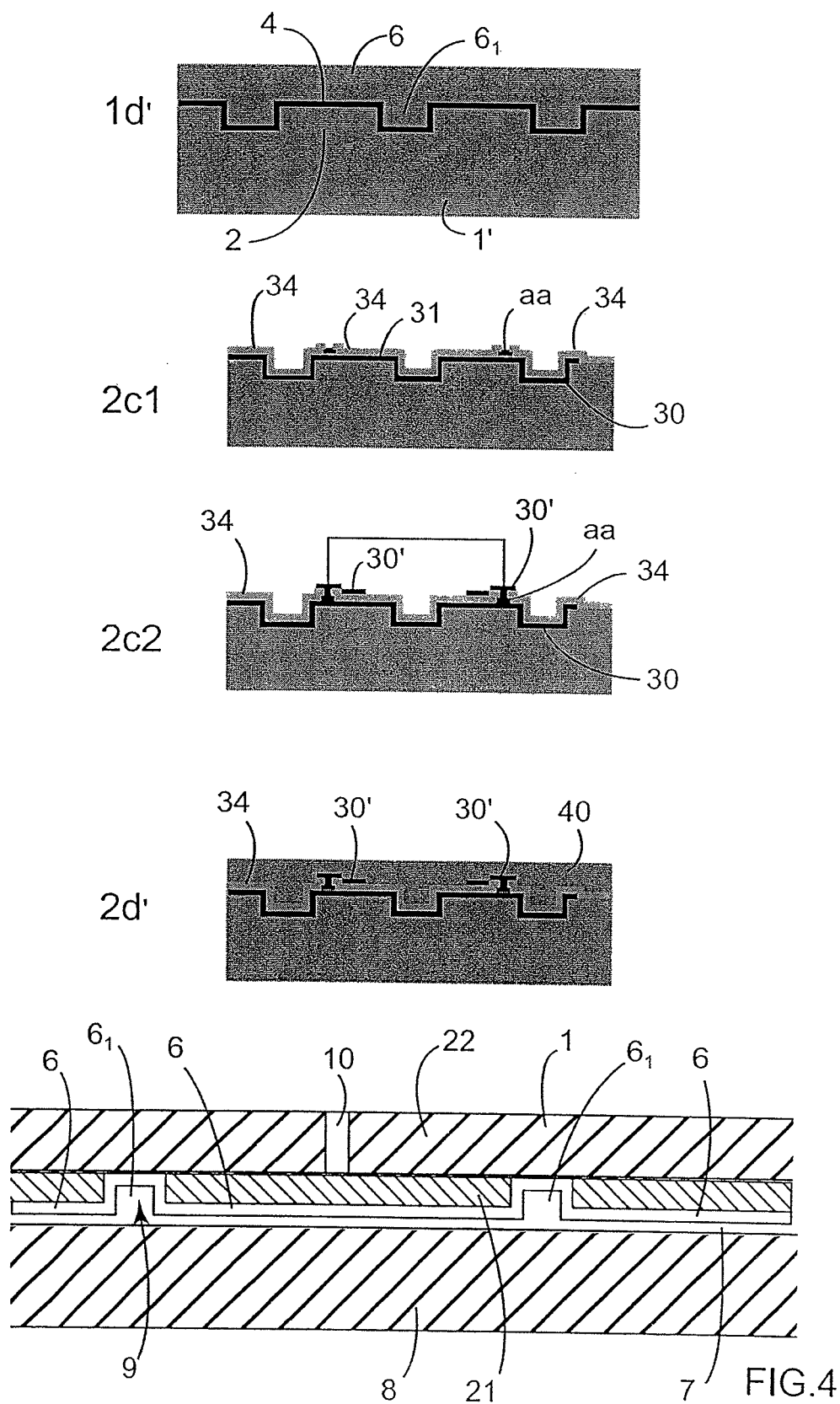

METHOD OF FABRICATING AN ELECTROMECHANICAL STRUCTURE INCLUDING AT LEAST ONE MECHANICAL REINFORCING PILLAR

CROSS REFERENCE TO RELATED APPLICATIONS

This application is a divisional application of application Ser. No. 12/488,841, filed Jun. 22, 2009, which claims priority from FR Application No. 08 03495 filed Jun. 23, 2008, the contents of which are incorporated by reference.

FIELD OF THE INVENTION

The present invention relates to a method of fabricating an electromechanical structure presenting a substrate of the monocrystalline layer type (being made in particular of silicon, germanium, perovskite, or quartz) on a sacrificial layer, in particular for a microsystem or a micro-electromechanical system (MEMS) or a nano-electromechanical system (NEMS), said substrate presenting at least one mechanical reinforcing region (or "pillar").

BACKGROUND OF THE INVENTION

So-called surface technologies (in contrast with bulk technologies) enable the size of electromechanical structures (MEMS and/or NEMS) made on silicon to be reduced. These technologies rely on using a stack of at least three layers: a mechanical layer (typically 0.1 micrometer ($\mu$m) to 100 $\mu$m thick); a sacrificial layer (typically 0.1 $\mu$m to a few $\mu$m thick); and a support (typically 10 $\mu$m to 1000 $\mu$m thick). Selective chemical etching of the sacrificial layer makes it possible to provide functional structures in the mechanical layer that are locally independent of the support.

The non-etched zones of the sacrificial layer enable so-called "anchor" zones or mechanical reinforcement zones (or "pillars") to be made that serve to connect the mechanical structure to the support.

In known methods that enable such pillars to be incorporated, e.g. the method described in application WO 2006/035031, a silicon substrate is assembled by molecular bonding to the top of the oxide layer, which oxide layer then acts as the sacrificial layer during final fabrication of the MEMS. During the final fabrication, trenches are formed through the silicon substrate that has been assembled by molecular bonding and the sacrificial layer is removed. The pillars serve to support the microsystem. During that operation, the interface zone between the added substrate and the remainder of the structure is subjected to chemical etching (in general with HF acid), thereby leading to shapes that are poorly controlled if the interface is not perfect, since the speed of etching is variable, and there is a risk of revealing the bonding interface. After the sacrificial layer has been removed, and the MEMS structure has been released, mechanical integrity is not good.

Other known methods that reflect that drawback are described in particular in U.S. Pat. No. 6,916,728 (FIGS. 9 and 10; column 6, lines 20 to 47) and U.S. Pat. No. 6,952,041 (FIGS. 4a to 4f; column 8; line 28 to column 9, line 49).

The article by T. Yamamoto et al. "Capacitive accelerometer with high aspect ratio single crystalline silicon microstructure using the SOI structure with polysilicon-based interconnect technique", published in MEMS 2000, the thirteenth annual international conference, Jan. 23-27, 2000, Miyazaki, Japan, pp. 514-519 does not present that drawback. Nevertheless, the pillars are made of thick poly-Si and their lateral size is limited by the technology. The pillars are made in the sacrificial layer by filling from a deposit of poly-Si. Filling takes place via the flanks of the cavity so the thickness of the filling is greater than half the width of the pillars. In order to avoid depositing layers of poly-Si that are too thick (typical maximum 3 $\mu$m), the lateral size of the pillar is typically limited to 5 $\mu$m.

If filling takes place via the bottom of the cavity, the thickness to be deposited is than about 3 times to 5 times the thickness of the sacrificial layer so as to enable the layer to be planarized.

The article by G. J. O'Brien and D. J. Monk entitled "MEMS process flow insensitive to timed etch induced anchor perimeter variation on SOI and bulk silicon wafer substrates", published in IEEE 2000, pp. 481-484, and U.S. Pat. No. 6,913,941, in particular its FIGS. 27 and 28, show pillars that pass both through the sacrificial layer and through the mechanical layer. In that configuration also, the cavities are filled via the flanks thereby limiting the lateral size of a pillar. Filling with poly-Si may be preceded by depositing a fine nitride layer to insulate the outside of the pillar.

Known methods are therefore limited to pillars of width that is limited to the thickness of the poly-Si layer used for filling them. For reasons of technology and of expense, the thicknesses used are typically of the order of a few $\mu$m, thereby limiting the lateral dimensions of pillars to a few $\mu$m.

There is another reason why known methods limit the lateral dimensions of pillars that are filled using poly-Si when the method contains a step of bonding a second silicon substrate (above-mentioned article by T. Yamamoto).

In order to make it easier to bond a first silicon substrate containing a thick layer (typically a few $\mu$m thick) of a material that is other than silicon (with different stress or expansion coefficients) on a second substrate of silicon, a known method consists in making a second layer of the second material on the other face of the first substrate with the same thickness as the first layer in order to compensate for the deformations induced by the differences between the said material and silicon, and make it easier to put the two substrates into contact during bonding. Such a method is described by Yamamoto, the first substrate containing as its thick layer at least the sacrificial layer of $SiO_2$. In the known methods of making pillars in the sacrificial layer, the material used for filling is thick poly-Si. Since the stress state of polycrystalline Si (at the time of deposition or during heating) is different from that of $SiO_2$, limiting the lateral dimensions of the pillars serves to limit non-uniformities in the sacrificial layer.

OBJECT AND SUMMARY OF THE INVENTION

The present invention proposes a fabrication method that enables mechanical reinforcing pillars to be fabricated in versatile manner, i.e. without limitation on their width, so their width can be a function of the intended application, and the pillars can be selected to be insulating or conductive at will, in particular in order to enable a contact to be made, while avoiding the drawback of any risk of revealing the bonding interface of a substrate on the sacrificial layer. A variant of the method makes it possible to limit the topology that stems from fabricating pillars.

The invention thus provides a method of fabricating an electromechanical structure presenting a first substrate including at least one layer of monocrystalline material covered in a sacrificial layer that presents a free surface, the structure presenting at least one mechanical reinforcing pillar received in said sacrificial layer, wherein the method comprises:

a) making at least one well region in the sacrificial layer by etching, at least in the entire thickness of the sacrificial layer, the well region defining at least one said mechanical pillar;

b) depositing a first functionalization layer of a first material, relative to which the sacrificial layer is suitable for being etched selectively, the functionalization layer filling at least one well region at least partially and covering the free surface of the sacrificial layer at least around the well region(s); and b') depositing a filler layer of a second material different from the first material for terminating the filling of the well region(s), said filler layer covering the first functionalization layer at least in part around the well region(s), and planarizing the filler layer, the pillar(s) being formed by the superposition of at least the first material and the second material in the well region(s);

and releasing the electromechanical structure by removing the sacrificial layer.

It should be observed that when the pillars pass through the sacrificial layer only, filling with the second material involves only a thickness that is substantially equal to the thickness of the sacrificial layer, and as a result there is no limit on making pillars that are wide (e.g. several tens of µm and more precisely 50 µm, for example).

The monocrystalline material may be selected in particular from Si, Ge, quartz, or indeed perovskite.

The substrate may be a thick Si substrate or it may be a substrate of the SOI type in particular, or indeed a substrate having a stop layer (SiGe, porous Si). The etching the sacrificial layer to form at least one well may be performed through at least one opening in a mask deposited on the sacrificial layer.

The planarization of the second layer may be continued until the first functionalization layer is reached, in particular to ensure that the second layer does not remain in the well regions.

The method may optionally include:

c) assembly with a second substrate opposite from the first substrate via an assembly surface of the first substrate. The second substrate is advantageously of the same kind as the monocrystalline layer of the first substrate.

Advantageously, the second substrate presents an assembly surface that is covered in a bonding layer, e.g. of silicon oxide.

Prior to step c), the invention may implement depositing a bonding layer on the first and/or second substrate with an interface being formed between these two substrates. A bonding layer in the second material may be made on the first substrate prior to bonding.

The first material may for example be silicon nitride or polycrystalline Si. The second material may be silicon oxide, or optionally doped polycrystalline Si, a metal, or a polymer.

The method may subsequently present a step d) of etching the sacrificial layer through at least one through opening in the first substrate in order to release the electromechanical structure. The first substrate is advantageously thinned prior to performing step d) by one or more filling techniques (chemical-mechanical planarization (CMP), rectification, dry etching, wet etching, . . . ).

Before or after step b') of depositing a filler layer and of planarizing the filler layer, the method may include a step b") of making at least one well in the first functionalization layer when said layer is an insulating layer and optionally in the filler layer, which well extends at least as far as the sacrificial layer, and depositing a conductive material at least in said well(s) to form at least one electrode.

It may be advantageous between steps b') and b") to deposit an additional layer of the first material in such a manner as to thicken the insulating first layer, in particular when the planarization of the second layer is continued until the first layer is reached.

After step b"), provision may be made to deposit a layer including at least one conductive region, e.g. a plane region forming a ground plane.

In order to make the conductive pillars that enable contact to be made, in particular interconnection to be made, the first layer may be made of a conductive material, in particular doped polycrystalline Si, a metal, or a metal and semiconductor alloy.

In a first variant, the method may include the first functionalization layer and a second functionalization layer, one of the functionalization layers being conductive and the other insulating, and between steps b) and b'), it may include a step $b_0$) of depositing the second functionalization layer, with the functionalization layer that is conductive forming a first interconnection level.

The second functionalization layer may be made of a third material selected from: silicon nitride; doped or insulating polysilicon Si; and a metal.

The first functionalization layer may cover a portion only of the well region(s), the other portion of the well regions being covered by the second functionalization layer, thereby enabling the conductive pillars and insulating pillars to be formed.

The sacrificial layer may be covered by both the first and second functionalization layers together.

Alternatively, the second functionalization layer may cover the entire surface of the sacrificial layer and of the third functionalization layer.

The second material of the filler layer may be selected to be identical to the material of the sacrificial layer.

In a variant where the first functionalization layer is insulating and thus the second functionalization layer is conductive, the method may include, after step $b_0$), a step $b'_1$) of depositing an insulating layer that forms a third functionalization layer.

Planarizing the filler layer may then be continued until the third functionalization layer is reached.

After step $b'_1$), the method may include a step $b'_2$) of making at least one via in said third functionalization layer and of depositing a conductor at least in said via, said deposit forming a contact on the conductive second functionalization layer so as to form a second interconnection level.

The method may include successively depositing additional functionalization layers alternatively of conductive material and of insulating material and making vias so as to form additional interconnection levels from the conductive layers.

The last of said interconnection levels may cover the entire surface so as to form a ground plane.

Alternatively, the last interconnection level is plane and includes interconnection areas to make it possible, during assembly with the second substrate, to connect elements of the second substrate to the electromechanical structure.

The invention also provides an electromechanical structure presenting a first substrate presenting at least one monocrystalline layer, a sacrificial layer, and at least one mechanical reinforcing (supporting) pillar received in the sacrificial layer, the structure being suitable for being fabricated by a method as defined above, and wherein at least one mechanical support region is a well region received at least in the entire thickness of the sacrificial layer, at least one said well region being covered in a first layer of a first mechanical support material and being filled with a second layer of a second mechanical support material, the pillar(s) being formed by superposing at least the first and second materials in the well region(s).

BRIEF DESCRIPTION OF THE DRAWINGS

The invention can be better understood on reading the following description with reference to the accompanying drawings, in which:

FIGS. 3a to 3d show a variant of the method of the invention enabling interconnection levels to be made using planar technology, with FIGS. 3c1 to 3c8 constituting an implementation with a plurality of interconnect levels; and FIG. 4 shows, by way of example, a pressure sensor made with the method of FIGS. 1a to 1f.

MORE DETAILED DESCRIPTION

Figure 1A:
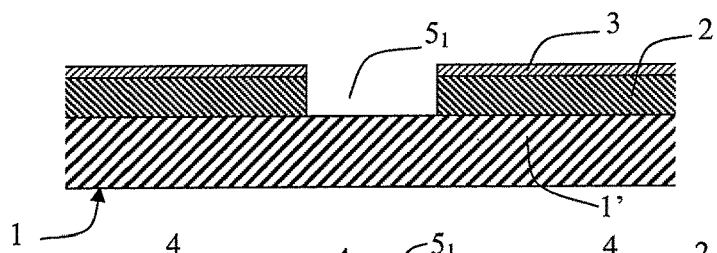
FIGS. 1a to 1f show a method of the invention that serves in preferred manner to make two-material reinforcements or pillars, FIG. 1d' showing an advantageous variant of the method.

FIGS. 1a to 1f show a preferred implementation of the method of the invention, serving to enable insulating pillars to be made from wide trenches (e.g. several tens of μm and more precisely 50 μm for example). The method starts with a substrate 1 presenting at least one monocrystalline layer 1' (e.g. of monocrystalline Si), coated in a sacrificial layer 2 (e.g. SiO$_2$). The layer 1' may occupy all of the substrate (thick Si substrate) or only a portion thereof (e.g. the top layer of an SOI substrate or some other type of substrate presenting an etching stop layer). Preferably, the initial substrate is a silicon substrate including a monocrystalline SiGe stop layer (not shown in the figure) and a monocrystalline silicon layer 1'. The layer 2 may be an oxide deposited by low pressure chemical vapor deposition (LPCVD) or by plasma-enhanced CVD (PECVD), or it may be made by thermally oxidizing the layer 1'. Its thickness may lie in the range 200 nanometers (nm) to 5 μm (typically in the range 2 μm to 3 μm).

A layer 3 of photosensitive resin is exposed to enable one or more zones such as 5$_1$ to be made in the layer 2 (FIG. 1a), these zones providing recesses for making the reinforcing region(s). The reinforcing regions may be open zones or they may be closed zones, e.g. annular or polygonal, as applies to a pressure sensor.

Figure 1B:
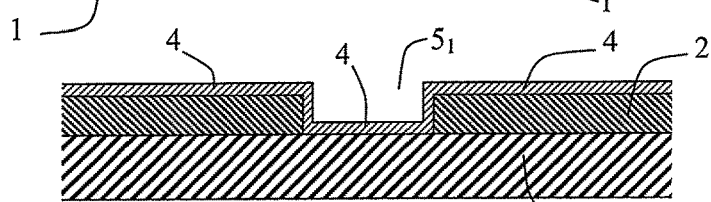
Figure 1C:
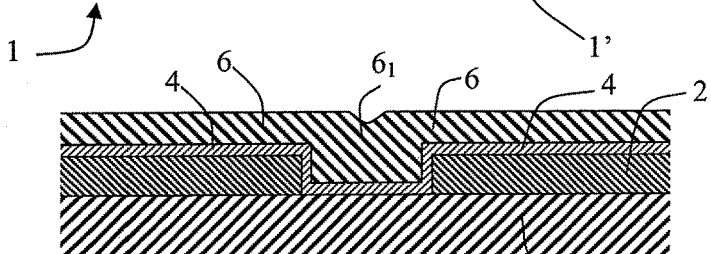
Figure 1D:
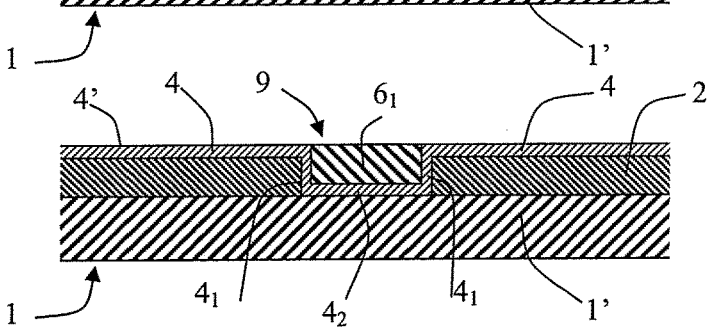
Figure 1E:
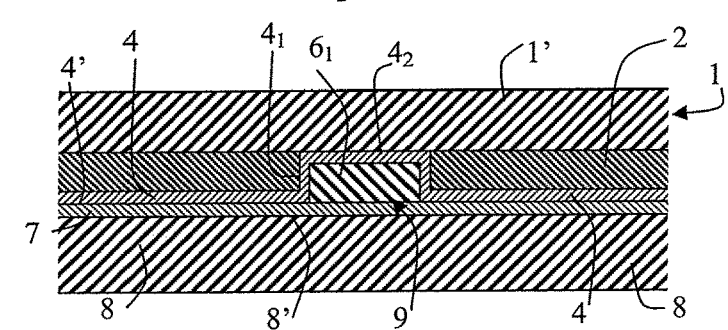

After removing the resin 3, a functionalization layer 4 is deposited on the layer 2, e.g. a silicon nitride layer having thickness lying for example in the range 10 nm to 500 nm, thereby providing a layer 4$_1$ on the side walls of the zone(s) 5$_1$, and a layer 4$_2$ on the bare face of the substrate 1 (FIG. 1b) (note: 4$_1$ and 4$_2$ can be seen in FIGS. 1b and 1e). The nitride may be deposited by chemical vapor deposition, in particular LPCVD or PECVD or by using atomic layer CVD (ALCVD). The layer 4 may also be made of optionally doped polysilicon, or of a metal, or of a metal and semiconductor alloy. It needs to present etching selectivity relative to the sacrificial layer. This layer does not necessarily cover the entire surface of the sacrificial layer (it may be etched locally). It enables insulating or conductive pillars to be made depending on the nature of the material constituting the functionalization layer 4, acting as etching stops for the sacrificial layer and as electrical contacts leading to the mechanical layer 1' when the pillars are conductive.

Alternatively, the region 4$_2$ of the layer 4 may be anchored in the layer 1' by using the technique described in French patent application FR 2 859 201. That involves continuing etching the zone 5$_1$ in the Si so as to be able subsequently to anchor the pillar in a shallow depth (e.g. 100 nm to 500 nm) by means of the region 4$_2$, but without the pillar going through said layer 1'. The etched zones in the sacrificial layer makes it possible to provide functional structures in the mechanical layer that are locally independent of the support.

The non-etched zones of the sacrificial layer make it possible to make so-called anchor zones or mechanical reinforcement zones (or "pillars"). The layer 4 is referred to as the "functionalization" layer since it enables functions to be added to the sacrificial layer: pillars made with etching stops, electrodes under the sacrificial layer, electrical connections between the mechanical layer and said electrodes, or between portions of the mechanical layer that are not interconnected.

Another insulating or non-insulating layer 6 referred to as a filler layer and made of a material that is different from the layer 4, e.g. of SiO$_2$, is then made (e.g. by LPCVD or by PECVD) so as to fill the zone(s) 5$_1$ and so as to cover all or part of the layer 4 covering the layer 2 (FIG. 1c). In particular, after providing total coverage as shown in FIG. 1c, it is possible to etch the layer 6 locally so that only a portion 6' remains surrounding the region(s) 5$_1$ (see Schiltz and Pons "Two-layer planarization process", J. Electrochem. Soc. 133: 178-181 (1986)). If the filler layer is made of the same material as the sacrificial layer, as in the example shown, then the layer 2 must cover the entire surface.

Thereafter, starting from the configuration of FIG. 1c, the filler layer 6 or 6' is planarized to terminate the mechanical reinforcement zone(s) or pillars 9 constituted by the regions 4$_1$, 4$_2$, 6$_1$ (FIGS. 1d and 1d'). The method used for this purpose is chemical mechanical planarization (CMP), for example. This planarization may be carried out so as to remove only a fraction of the thickness of the layer 6 (FIG. 1d'), or as shown in FIG. 1d, it may be continued and come to an end at the layer 4 of silicon nitride, allowing a substantially plane face to appear at the pillar (4$_1$, 4$_2$, 6$_1$). Thereafter, a thin bonding layer 7 is deposited, e.g. an oxide layer (optionally followed by CMP), thereby making it possible subsequently to add on a substrate 8 of monocrystalline Si by molecular bonding (molecular bonding between Si and SiO$_2$), optionally oxidized at its surface that comes into contact with the layer 7 (molecular bonding SiO$_2$ and SiO$_2$) (FIG. 1e). This deposit is optional when only a portion of the thickness of the layer 6 is removed (FIG. 1d'). It may also be omitted from the configuration of FIG. 1d, but that leads to bonding via a heterogeneous interface, thereby giving rise, other things being equal, to bonding energies that are smaller.

An important reason for selecting SiO$_2$ as a filler is its ability to be deposited as a thick layer with little mechanical stress relative to the other materials such as silicon nitride or polysilicon, and also because of its suitability for being planarized with the thoroughly-mastered CMP technique. Furthermore, when the sacrificial layer is also made of SiO$_2$, that makes it possible to limit non-uniformities of the sacrificial layer after functionalization; the layer is made for the great majority out of a single material. The filler layer is thus preferably made out of the same material as the sacrificial layer.

In order to obtain a silicon substrate 1 of thickness suitable for making an MEMS (e.g. 5 μm to 50 μm thick), it is general practice to begin with a starting substrate that is thicker than the single layer 1', with this substrate subsequently being thinned to the desired thickness after the substrate 8 has been molecular bonded thereto. Such thinning may be performed by rectification followed by CMP.

When the layer 1' is made of monocrystalline silicon grown on the SiGe stop layer, the silicon portion of the initial substrate is rectified to a thickness of about 10 μm. The thickness is determined by the accuracy that is available for this rectification step and also in such a manner that the layer 1' does not include any work-hardened zones, which zones are created during the rectification step. It is thus a function in particular of the desired speed of rectification.

The thickness of the remaining Si of the initial substrate is subsequently removed by chemical etching, stopping at the SiGe stop layer. Various methods are known for etching Si and stopping on SiGe. Mention can be made of wet etching methods (mixtures of the tetramethylammonium hydroxide (TMAH) or of the KOH type, cf. bibliography on selecting etching) or dry etching (Japanese Journal of Applied Physics, Vol. 43, No. 6B, 2004, pp. 3964-3966, 2004 The Japan Society of Applied Physics). The stop layer is subsequently removed by chemical etching stopping at the Si of the layer 1'.

Various known methods exist for etching SiGe and stopping on Si. Mention can be made of high temperature HCl etching methods ("Selective chemical vapor etching of $Si_{1-x}Ge_x$ versus Si with gaseous HCl", by Y. Bogumilowicz, H. M. Hartmann, J. M. Fabri, and T. Bilon, in Semicond. Sci. Technol. 21, No. 12 (December 2006), pp. 1668-1674, chemical etching methods based on mixtures of the hydrofluoric acid, nitric acid, and acetic acid (HNA) type, and dry etching methods (see above-mentioned article in Japanese Journal of Applied Physics). This use of a starting substrate made up of a layer of SiGe on thick silicon provides better control over the final thickness of the layer 1'.

Depositing the layer 7 is optional, it being possible for the substrate 8 to be added by the technique described in patent application WO 2006/035031. That technique enables molecular bonding to be established between the substrate 8 and the surface made up of two different materials, in particular silicon nitride and $SiO_2$.

The method continues (FIG. 1e) in the upside-down position, as in the prior art method described in the introduction to the present description.

Then, the process according to the invention further comprises a step of releasing the electromechanical structure by removing at least partially the sacrificial layer 2. The removal of the sacrificial layer can be done by etching openings 10, but also by any other means.

Figure 1F:
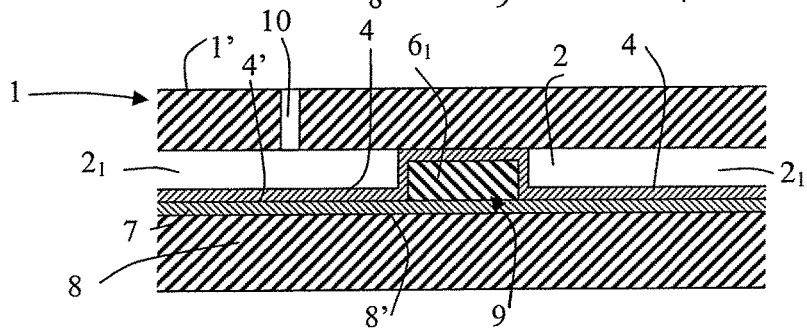

The Si layer 1' is etched to make one or more openings 10 (FIG. 1f). These openings 10 may also serve to define the MEMS structure in the layer 1' and they are used to remove the sacrificial layer 2 by forming one or more cavities $2_1$ with the help of hydrofluoric acid in the liquid phase or the vapor phase, when etching a layer of $SiO_2$, such that the active structure of FIG. 1 is held by the pillar(s) ($4_1$, $4_2$, $6_1$). The pillar materials are selected so as to be selective relative to the solution used for etching the sacrificial layer. The mechanical structure is thus made in the layer 1' which can be referred to as a mechanical layer.

It can be seen that the interface zone 8' between the substrate 8 fitted by molecular bonding and the layer 7 is protected from any chemical etching when making the opening(s) 10 and when releasing the MEMS structure by using HF acid to remove the sacrificial layer 2.

FIGS. 2a to 2d show a variant embodiment in which the pillars include a conductive layer, here made of polycrystalline Si, thus enabling contacts to be made, and indeed multiple interconnection levels by combining conductive pillars and insulating pillars.

Figure 2A:
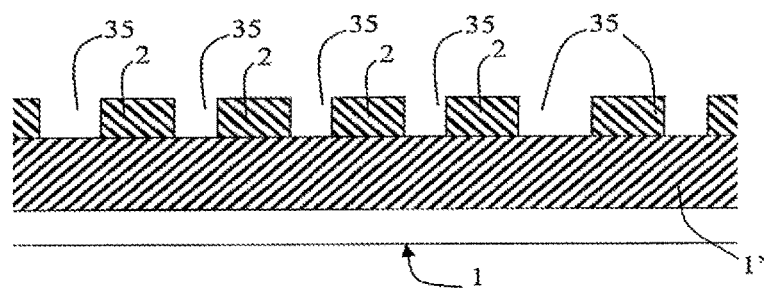
FIGS. 2a to 2d show a variant of the method of the invention in which there are so-called conductive or insulating pillars, and FIGS. 2c1, 2c2, and 2d' show an implementation having a second level of interconnection.

As in FIG. 1a, FIG. 2a shows wells 35 being made in the sacrificial layer 2, e.g. made of $SiO_2$, on a substrate 1 comprising in particular a layer 1', e.g. made of monocrystalline Si.

Figure 2B:
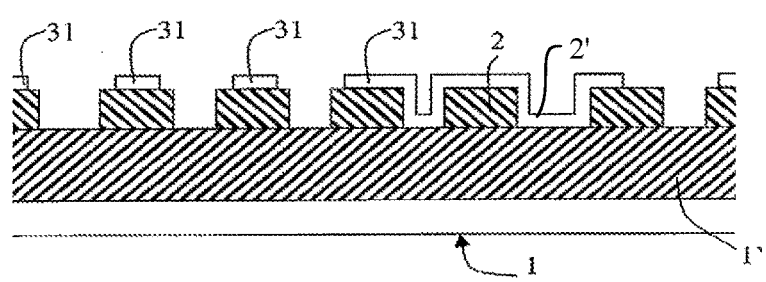

FIG. 2b shows localized deposition (deposition over the entire surface and then localized etching) of an insulating first functionalization layer 31 made of silicon nitride, in particular on well zones where the insulating pillars are to be made. This nitride layer serves to provide insulating pillars and to isolate the polycrystalline Si layer (see description below) chemically from the mechanical layer 1' and the sacrificial layer 2 of the filler layer when made of the same material as the sacrificial layer such that the sacrificial layer 2 presents a free surface 2'.

Figure 2C:
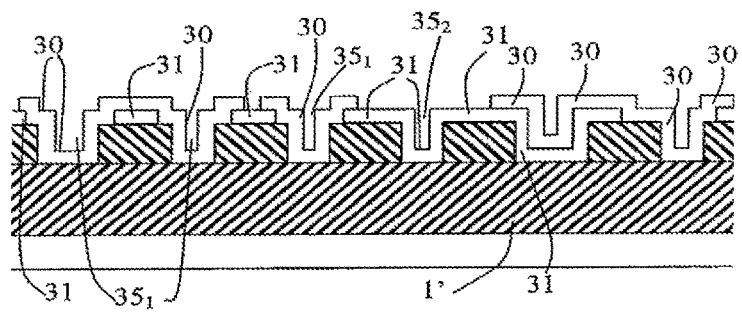

FIG. 2c shows the localized deposition (in particular by deposition of the entire surface followed by localized etching) of a conductive second functionalization layer 30, e.g. of doped polycrystalline Si in well regions $35_1$ where it is desired to make pillars that also perform a conductive function, in particular for making contact with the layer 1' (mechanical layer). Outside well regions, this layer may also serve to make a first interconnection level or electrodes. The other wells $35_2$ may have no deposit of polycrystalline Si in order to limit capacitive coupling at the insulating pillars. This does not apply if, for reasons of topology, an electrical connection needs to be passed through an insulating pillar as shown in the wells $35_1$. It should be observed that the insulating functionalization layer 31 may be deposited after the conductive functionalization layer 30. However if the materials of the layers 1' and 30 cannot be etched selectively, then etching the functionalization layer in the wells needs to be performed in two stages: the functionalization layer is etched in the wells $35_1$, and then after the layer 30 has been made, the functionalization layer is etched in the wells $35_2$.

Figure 2D:
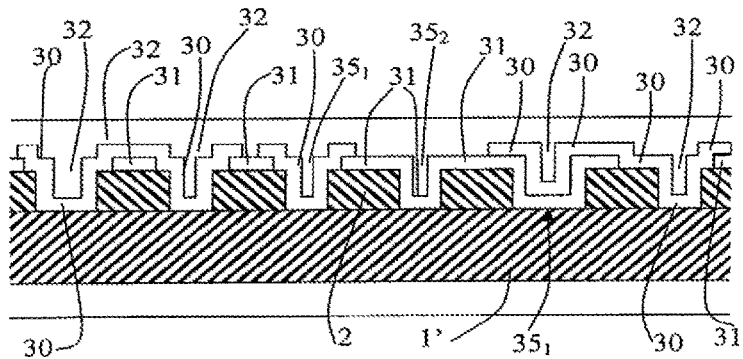

FIG. 2d shows deposition of a filler layer 32, e.g. of $SiO_2$, for filling the wells 35. This deposition is subsequently planarized by using a thinning technique, e.g. the CMP method.

The pillars thus have either an external conductive layer 31 made of polycrystalline Si, or else an insulating layer 30 at a layer 32, e.g. of $SiO_2$, constituting the core thereof. Depending on circumstances, the pillars are therefore made of two materials or of three materials.

FIGS. 2c1, 2c2, and 2d' show an embodiment including a second level of interconnection layer, here made by polycrystalline Si.

This second level of interconnection layer enables tracks to be made that electrically interconnect two conductive zones 30 made of polycrystalline Si (conductive pillars or electrodes) that are not interconnected by the first level, for topological reasons.

FIG. 2c1 shows an insulating layer 34 (nitride or oxide) being deposited for the purpose of insulating the interconnection layers. This layer is etched locally with etching stopping at the layer 30, thereby enabling electrical accesses (aa) to be provided on the zones 30 for connection.

FIG. 2c2 shows a second localized conductive layer being made that serves to interconnect the electrical accesses (aa) in application of the interconnection scheme. Vias are thus provided between the first and second interconnection levels.

These operations (depositing the insulating layer with openings, localized deposition of polycrystalline Si) can be repeated so as to make multiple interconnection levels using additional conductive and insulating functionalization layers.

In particular, a last layer can be made as a layer that covers the entire component, optionally being connected to one or more tracks of the lower layers, and acting as a ground plane for the MEMS system.

Depending on circumstances, the ground plane may also be made at the same level as the last track, in which case it covers part of the surface only.

Finally, FIG. 2d' shows a filler and bonding layer 40, e.g. made of silicon oxide, being deposited on the structure obtained in FIG. 2c2.

FIGS. 3a to 3d show another variant of the method enabling the topology due to the various deposited layers to be limited: each localized deposition increases the topology of the final stack initially created by making zones such as $5_1$ in the sacrificial layer.

FIG. 3a shows the substrate after layers of nitride 31 and of polycrystalline Si 30 have been deposited in succession using a method such as that described with reference to FIGS. 2a to 2c. To obtain a plane reference surface, the SiN layer 31 is made over the entire substrate apart from the zones of the polycrystalline Si pillars (layer 30). In the same manner, the polycrystalline Si layer is made over the entire surface of the layer 2, removing only the zones that serve to insulate those zones that need to be insulated.

FIG. 3b shows an additional layer 35 made of SiN being deposited that serves as a reference for rectifying the filler layer.

FIG. 3c shows deposition of the filler layer 36 made of $SiO_2$ after chemical mechanical planarizing (CMP) stopping at the SiN layer 35.

FIG. 3d shows deposition and planarizing of a second bonding layer 37, e.g. made of $SiO_2$, serving to achieve bonding.

It is also possible to make multiple interconnection levels using the so-called "double damascene" principle. After the steps of FIG. 3c, an additional oxide layer is made (FIG. 3c1) for use as insulation. This layer is locally etched to make openings (FIG. 3c2) corresponding to electrical connections between interconnection tracks. A polycrystalline Si layer is deposited on the entire plate, followed by CMP, stopping at the oxide, thereby leaving polycrystalline Si 39' only in the openings 39 (FIG. 3c3).

FIG. 3c4 shows nitride and oxide layers 50 and 51 being deposited in succession. Openings 52 are made by successively etching the oxide 51 (stop on nitride) and then the nitride 50 (stop on oxide) that corresponds to the interconnection tracks (FIG. 3c5). The tracks 53 are made (FIG. 3d6) by depositing doped polycrystalline Si with CMP and stopping on the oxide constituting the layer 51.

If an additional interconnection level is needed, the same principle can be repeated: an oxide layer 54 is made with Openings 55 being created therein (stop at the polycrystalline Si of the tracks 53) for the electrical connections (FIG. 3c7). These openings are filled with doped polycrystalline Si 56 by full wafer deposition, followed by CMP stopping at the oxide of the layer 54. The steps described in FIGS. 3c4 to 3c6 are repeated.

Starting from the steps of FIG. 3c3, it is possible to replace the polycrystalline Si with a metal, such as copper, for example.

Under such circumstances, it is possible to replace the substrate 8 with a substrate having CMOS circuits and terminated by a layer of Cu areas in a matrix of $SiO_2$. In this variant, the bonding layer of FIG. 3d is not added since it is the combined oxide and Cu layer that acts as the bonding layer. This bonding serves to provide electrical connections between the MEMS substrate and the associated CMOS circuit substrate. Only a fraction of the metal areas needs to serve as electrical connections between the MEMS and the CMOS circuit, with the remainder being made to increase the effective bonding area. Under such circumstances, the electrical connection with the MEMS and CMOS circuit assembly take place via contacts made at the surface of the MEMS.

It should be observed that the principle of bonding a CMOS circuit from an array of metal areas can be implemented even if the method used for making interconnections it not planar. For example, starting from the substrate of FIG. 2d', it is possible to make a plane of contact areas by adding a nitride layer and an oxide layer and then by making the array of areas using the method described Starting from FIG. 3c4.

The plane of contact areas may be replaced by a continuous metal plane connected to a limited number of MEMS connection tracks and enabling electrical contacts to be established between the support and the MEMS ground.

By way of example, FIG. 4 shows a pressure sensor made in accordance with the method of FIGS. 1a to 1f. An opening 10 is made through the substrate 1 within the perimeter of a pillar 9 ($4_1$, $4_1$, $6_1$) of annular shape, and this opening is used for removing the sacrificial layer 2 within this perimeter so as to form a cavity 21. The opening 10 is then recovered in conventional manner, e.g. with polycrystalline silicon phosphosilicate glass (PSG). The region 22 of the substrate 1 that is situated in the perimeter of the pillar 9 forms the diaphragm of the pressure sensor and it is mechanically supported by the pillar.

It is naturally possible to define one or more openings 10 for making MEMS of more complicated structure, e.g. including one or more fixed-end beams.

Although the examples given essentially illustrate making a substrate in which the monocrystalline layer is made of silicon associated with a sacrificial layer made of $SiO_2$, the invention enables substrate variants to be made, in particular a substrate with a layer of monocrystalline germanium associated with a sacrificial layer of $SiO_2$, or indeed a substrate with a layer of monocrystalline perovskite associated with a sacrificial layer of polycrystalline Si or of $SiO_2$.

What is claimed is:
1. A method of fabricating an electromechanical structure presenting a first substrate (1) including at least one layer (1') of a monocrystalline material, said at least one layer being covered with a sacrificial layer (2), said sacrificial layer presenting a free surface, said electromechanical structure presenting at least one mechanical reinforcing pillar received in said sacrificial layer, wherein the method comprising:
   a) making at least one well region (35, $35_1$, $35_2$) in the sacrificial layer (2) by etching at least in the entire thickness of the sacrificial layer (2), said at least one well region defining said at least one mechanical reinforcing pillar;

b) depositing a first functionalization layer (30) of a first functionalization material, relative to which the sacrificial layer is suitable for being etched selectively, and a second functionalization layer (31) of a second functionalization material, wherein said first functionalization material is conductive, and said second functionalization material is insulating, said first functionalization layer (30) filling said at least one well region (35) at least partially and covering the free surface of the sacrificial layer (2) such that said first functionalization layer is localized at least around said at least one well region, said sacrificial layer being suitable for being etched selectively to said first functionalization material and said second functionalization material;

b') depositing a filler layer (32) of a filler material different from the first functionalization material and said second functionalization material for terminating the filling of said at least one well region, said filler layer (32) covering the first functionalized layer and said second functionalization layer (30, 31) at least in a part around said at least one well region (35), and planarizing the filler layer (32), such that at least a part of only the filler layer is removed, said at least one mechanical reinforcing pillar being formed and defined by a superposition of at least the first functionalization material or the second functionalization material and also of the filler material in said at least one well region (35).

2. The method according to claim 1, wherein the monocrystalline material is selected from Si, Ge, quartz, or a perovskite.

3. The method according to claim 1, wherein said filler layer is subsequently planarized by using a chemical-mechanical planarization.

4. The method according to claim 1, wherein the first functionalization material is selected from: silicon nitride; doped or polycrystalline Si or a metal.

5. The method according to claim 1, wherein the filler material is selected from: silicon oxide; doped or insulating polycrystalline Si; or a polymer.

6. The method according to claim 1, wherein said first functionalization material, forms a first interconnection level which serves to make an electrical connection between said at least one layer of the monocrystalline material and said first functionalization layer.

7. The method according to claim 6, wherein the sacrificial layer is covered by both the first functionalization layer and the second functionalization layer, together.

8. The method according to claim 1, wherein said second functionalization material is selected from: silicon nitride or insulating polysilicon Si.

9. The method according to claim 1, wherein the filler material of the filler layer is selected to be identical to a material of the sacrificial layer.

* * * * *